(12) United States Patent
Tanimura et al.

(10) Patent No.: US 6,750,672 B2
(45) Date of Patent: Jun. 15, 2004

(54) SEMICONDUCTOR INSPECTING SYSTEM FOR INSPECTING A SEMICONDUCTOR INTEGRATED CIRCUIT DEVICE, AND SEMICONDUCTOR INSPECTING METHOD USING THE SAME

(75) Inventors: Masaaki Tanimura, Hyogo (JP); Mitsuhiro Hamada, Hyogo (JP); Osamu Hashimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 59 days.

(21) Appl. No.: 10/119,067

(22) Filed: Apr. 10, 2002

(65) Prior Publication Data

US 2003/0016045 A1 Jan. 23, 2003

(30) Foreign Application Priority Data

Jul. 19, 2001 (JP) ........................................ 2001-219457

(51) Int. Cl.7 .............................................. G01R 31/02
(52) U.S. Cl. ...................................... 324/765; 324/759
(58) Field of Search ................................ 324/765, 754, 324/158.1, 758, 72.5, 73.1; 714/719, 724, 720, 718; 365/201; 438/17–19

(56) References Cited

U.S. PATENT DOCUMENTS

| 5,225,775 A | * | 7/1993 | Sekino ................... 324/158.1 |
| 6,566,899 B2 | * | 5/2003 | Tamaru et al. .............. 324/754 |
| 6,583,639 B1 | * | 6/2003 | Vogley ....................... 324/765 |
| 6,586,924 B1 | * | 7/2003 | Okayasu et al. ......... 324/158.1 |

FOREIGN PATENT DOCUMENTS

| JP | 7-27828 | 1/1995 |
| JP | 2001-021620 | 1/2001 |
| JP | 2001-183419 | 7/2001 |

* cited by examiner

*Primary Examiner*—Evan Pert
*Assistant Examiner*—Jimmy Nguyen
(74) *Attorney, Agent, or Firm*—McDermott, Will & Emery

(57) ABSTRACT

An apparatus to be inspected is mounted on one surface of a socket board. An auxiliary inspecting apparatus for adjusting timing of write signals transmitted from a semiconductor inspecting apparatus is mounted on the other surface of the socket board. Input/output (I/O) pins of the auxiliary inspecting apparatus are connected to corresponding I/O pins of the inspected device via through holes in the socket board on a one-to-one basis. This semiconductor inspecting method is thus capable of easily suppressing the delay difference between a plurality of signals output from the semiconductor inspecting apparatus.

13 Claims, 11 Drawing Sheets

↓ HIGHER FREQUENCY

↓ HIGHER FREQUENCY

SEMICONDUCTOR INSPECTING SYSTEM FOR INSPECTING A SEMICONDUCTOR INTEGRATED CIRCUIT DEVICE, AND SEMICONDUCTOR INSPECTING METHOD USING THE SAME

BACKGROUND OF THE INVENTION

1. Field of the Invention

The present invention generally relates to a semiconductor inspecting method for inspecting a semiconductor integrated circuit device. More particularly, the present invention relates to a semiconductor inspecting method using a semiconductor inspecting apparatus.

2. Description of the Background Art

The semiconductor integrated circuit devices are subjected to evaluation test before shipment using a semiconductor inspecting apparatus, so that only the non-defective products are shipped.

FIG. 16 is a block diagram showing the schematic structure of a conventional semiconductor inspecting apparatus.

Referring to FIG. 16, the semiconductor inspecting apparatus 1 includes a main body 10 and a general-purpose board 20.

The general-purpose board 20 is connected to the main body 10 through connectors 70. The general-purpose board 20 is mounted for signal transmission between the main body 10 and a semiconductor integrated circuit device 50 to be inspected.

Each pad 31 of a socket board 30 is connected to the general-purpose board 20 through a coaxial cable 60. The general-purpose board 20 and the socket board 30 are replaced according to the type of the semiconductor integrated circuit device 50 to be inspected.

The semiconductor integrated circuit device 50 to be inspected (hereinafter, sometimes referred to as inspected device 50) is connected to the socket board 30 through an IC (integrated circuit) socket 40. The IC socket 40 electrically connects input/output (I/O) pins of the inspected device 50 to the pads 31.

The semiconductor inspecting apparatus 1 transmits a plurality of test pattern signals to the inspected device 50 as write signals. The inspected device 50 outputs read signals according to the write signals. The main body 10 receives the read signals from the inspected device 50 and determines whether the inspected device 50 is defective or not.

In recent years, rapid response to external circuit devices has been required for the semiconductor integrated circuit devices. In particular, a higher frequency has been increasingly used for the synchronous semiconductor integrated circuit devices operating in synchronization with an external clock signal. As a result, AC (alternating current) parameter values such as setup time, hold time and access time of the external clock signal and each control signal have been increasingly reduced.

Such an increased response speed of the semiconductor integrated circuit device requires that the semiconductor inspecting apparatus be capable of receiving and determining a high-frequency signal and also accurately adjusting the difference in timing of applying each signal to the inspected device (hereinafter, such a difference is referred to as skew).

One method for adjusting the skew is to adjust the skew on a pin-by-pin basis of the IC socket by using an oscilloscope and a reference comparator in order to accurately adjust the timing at the IC socket end connected to the semiconductor inspecting apparatus and the inspected device. In another method, pins of IC sockets are short-circuitted with each other, and delay difference of signals flowing between each of the short-circuitted pins is measured and adjusted by the semiconductor inspecting apparatus. The information on the adjustment result of such methods is stored in the semiconductor inspecting apparatus for use in semiconductor inspection.

Such skew-adjusting methods have variation in accuracy due to the difference between the environment upon adjusting the skew and the environment upon inspection. For example, if the ambient temperature of the semiconductor inspecting apparatus upon adjusting the skew is different from that upon inspection, characteristics of the circuitry within the semiconductor inspecting apparatus such as a timing generation circuit are varied.

One countermeasure against such variation in accuracy due to the environment is to use a cooling mechanism for circulating a liquid retained at an approximately constant temperature around the main circuitry in the semiconductor inspecting apparatus such as the timing generation circuit. This prevents temperature rise resulting from the effects of the ambient temperature of the semiconductor inspecting apparatus and the heat generated by the main circuitry itself in the semiconductor inspecting apparatus, thereby enabling accurate inspection by the semiconductor inspecting apparatus.

However, the aforementioned skew adjusting methods complicate the circuit structure of the semiconductor inspection apparatus, resulting in increased costs of the semiconductor inspection apparatus.

SUMMARY OF THE INVENTION

It is an object of the present invention to provide a semiconductor inspecting method capable of easily suppressing the delay difference between a plurality of signals output from a semiconductor inspecting apparatus.

According to one aspect of the present invention, a semiconductor inspecting system for inspecting a semiconductor integrated circuit device includes: a semiconductor inspecting apparatus; a socket board for mounting the semiconductor integrated circuit device thereon for inspection; and an auxiliary inspecting apparatus mounted on the socket board. The auxiliary inspecting apparatus includes a receiving circuit for receiving a plurality of write signals from the semiconductor inspecting apparatus, a timing adjustment circuit for adjusting timing of the plurality of write signals, an output circuit for outputting the write signals adjusted by the timing adjustment circuit to the semiconductor integrated circuit device, and an input/output (I/O) terminal for receiving and outputting the write signals.

Thus, timing adjustment of the write signals can be conducted in the auxiliary inspecting apparatus. This enables suppression of the delay difference between the write signals that are applied to the semiconductor integrated circuit device.

Preferably, the auxiliary inspecting apparatus further includes a determination circuit for determining whether a signal output from the semiconductor integrated circuit device in response to each write signal is a prescribed signal or not.

Thus, the determination can be made before the delay difference is produced between the signals output from the semiconductor integrated circuit device, thereby improving semiconductor inspection accuracy.

Preferably, the auxiliary inspecting apparatus is included in another semiconductor integrated circuit device having a same specification as that of the semiconductor integrated circuit device.

This enables one of the semiconductor integrated circuit devices to be used as an auxiliary inspecting apparatus in order to inspect a semiconductor integrated circuit device of a new standard. This eliminates the need to fabricate an additional auxiliary inspecting apparatus according to change in standard of the semiconductor integrated circuit device.

Preferably, the semiconductor inspecting system further includes an IC (integrated circuit) socket. The auxiliary inspecting apparatus is included in the IC socket. The IC socket includes a spring for enabling electric connection between the I/O terminal of the auxiliary inspecting apparatus and a corresponding I/O terminal of the semiconductor integrated circuit device. The semiconductor integrated circuit device is connected to the socket board through the IC socket.

This facilitates replacement of the semiconductor integrated circuit device. This also facilitates replacement of the auxiliary inspecting apparatus in the case of a failure.

According to another aspect of the present invention, a semiconductor inspecting system for inspecting a semiconductor integrated circuit device includes: a semiconductor inspecting apparatus; a socket board for mounting the semiconductor integrated circuit device thereon for inspection; and an auxiliary inspecting apparatus mounted on the socket board. The auxiliary inspecting apparatus includes a pattern generation circuit for generating a plurality of write signals, a determination circuit for determining whether a signal output from the semiconductor integrated circuit device in response to each write signal is a prescribed signal or not, and an input/output (I/O) circuit for outputting the write signals to the semiconductor integrated circuit device, outputting the determination result of the determination circuit to the semiconductor inspecting apparatus, and receiving the signals output from the semiconductor integrated circuit device.

Thus, the auxiliary inspecting apparatus outputs the write signals and determines the semiconductor integrated circuit device. By mounting the auxiliary inspecting apparatus near the semiconductor integrated circuit device, the delay difference between the write signals can be suppressed. Moreover, since the auxiliary inspecting apparatus determines the semiconductor integrated circuit device, semiconductor inspection accuracy is improved.

According to still another aspect of the present invention, a semiconductor inspecting method for inspecting a semiconductor integrated circuit device using a semiconductor inspecting system including a semiconductor inspecting apparatus and an auxiliary inspecting apparatus includes the steps of: mounting the auxiliary inspecting apparatus and the semiconductor integrated circuit device on a same socket board; outputting a plurality of write signals from the semiconductor inspecting apparatus to the auxiliary inspecting apparatus; adjusting timing of the plurality of write signals by the auxiliary inspecting apparatus; and receiving the adjusted signals by the semiconductor integrated circuit device.

Thus, timing adjustment of the write signals can be conducted in the auxiliary inspecting apparatus. This enables suppression of the delay difference between the write signals that are applied to the semiconductor integrated circuit device.

Preferably, the semiconductor inspecting method further includes the steps of: outputting a signal from the semiconductor integrated circuit device in response to each write signal; receiving the signal from the semiconductor integrated circuit device by the auxiliary inspecting apparatus; and determining by the auxiliary inspecting apparatus whether the signal output from the semiconductor integrated circuit device is a prescribed signal or not.

Thus, the determination can be made before the delay difference is produced between the signals output from the semiconductor integrated circuit device, thereby improving semiconductor inspection accuracy.

Preferably, the step of mounting the auxiliary inspecting apparatus and the semiconductor integrated circuit device on the same socket board includes the steps of (a) mounting the auxiliary inspecting apparatus on one surface of the socket board, and (b) mounting the semiconductor integrated circuit device on the other surface of the socket board. In the steps (a) and (b), an I/O terminal of the auxiliary inspecting apparatus is connected to a corresponding I/O terminal of the semiconductor integrated circuit device via a through hole.

Thus, the wirings required on the socket board can be minimized, enabling suppression of the signal delay difference resulting from the wiring length.

Preferably, the step of mounting the auxiliary inspecting apparatus and the semiconductor integrated circuit device on the same socket board includes the steps of connecting the auxiliary inspecting apparatus to the socket board through an IC socket, and connecting the semiconductor integrated circuit device to the socket board through an IC socket.

This facilitates replacement of the auxiliary inspecting apparatus or the semiconductor integrated circuit device.

Preferably, the step of mounting the auxiliary inspecting apparatus and the semiconductor integrated circuit device on the same socket board includes the step of (c) connecting the semiconductor integrated circuit device to the socket board through an IC socket including the auxiliary inspecting apparatus. In the step (c), an I/O terminal of the semiconductor integrated circuit device is connected to a corresponding I/O terminal of the auxiliary inspecting apparatus included in the IC socket.

This facilitates replacement of the semiconductor integrated circuit device. This also facilitates replacement of the auxiliary inspecting apparatus in the case of a failure.

According to yet another aspect of the present invention, a semiconductor inspecting method for inspecting a semiconductor integrated circuit device using a semiconductor inspecting system including a semiconductor inspecting apparatus and an auxiliary inspecting apparatus includes the steps of: outputting a test pattern from the auxiliary inspecting apparatus to the semiconductor integrated circuit device; outputting a signal from the semiconductor integrated circuit device in response to each write signal; receiving the signal from the semiconductor integrated circuit device by the auxiliary inspecting apparatus; determining by the auxiliary inspecting apparatus whether the signal output from the semiconductor integrated circuit device is a prescribed signal or not; and transmitting the determination result from the auxiliary inspecting apparatus to the semiconductor inspecting apparatus.

Thus, the auxiliary inspecting apparatus outputs the write signals and determines the semiconductor integrated circuit device. By mounting the auxiliary inspecting apparatus near the semiconductor integrated circuit device, the delay difference between the write signals can be suppressed.

Moreover, since the auxiliary inspecting apparatus determines the semiconductor integrated circuit device, semiconductor inspection accuracy is improved.

According to a further aspect of the present invention, a semiconductor inspecting method for inspecting a semiconductor integrated circuit device using a semiconductor inspecting apparatus includes the steps of: (d) mounting on one surface of a socket board of the semiconductor inspecting apparatus the semiconductor integrated circuit device to be inspected; (e) mounting another semiconductor integrated circuit device on the other surface of the socket board, the another semiconductor integrated circuit device having a same specification as that of the semiconductor integrated circuit device and having been determined as non-defective; (f) outputting a plurality of write signals from the semiconductor inspecting apparatus to the semiconductor integrated circuit devices; and (g) receiving by the semiconductor inspecting apparatus a power supply current flowing through the semiconductor integrated circuit device in response to the write signals.

By using as a reference sample the semiconductor integrated circuit device having been determined as non-defective by inspection, accurate inspection can be conducted in a more simplified manner.

Preferably, the steps (d) and (e) include the step of connecting the semiconductor integrated circuit devices to the socket board through an IC socket.

This facilitates replacement of the semiconductor integrated circuit device.

According to the present invention, the auxiliary inspecting apparatus is mounted near the device to be inspected, and timing adjustment of the write signals is conducted in the auxiliary inspecting apparatus. This facilitates suppression of the signal delay difference resulting from the impedance of coaxial cables.

A non-defective inspected device may be used as a reference sample instead of the auxiliary inspecting apparatus. In this case as well, the signal delay difference can be easily suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
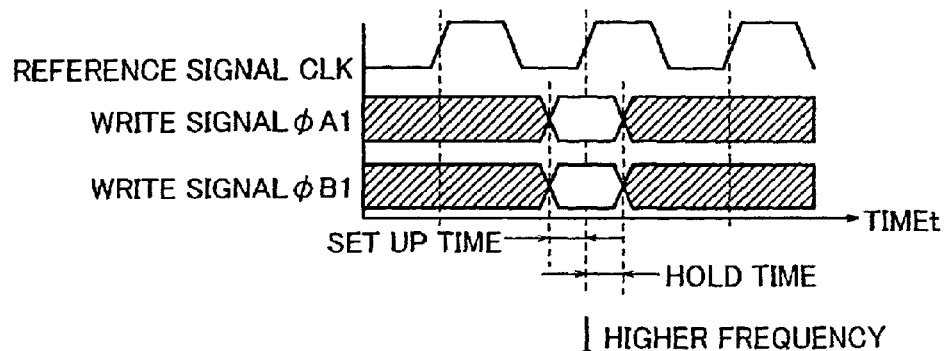
FIG. 1A is a timing chart of the write signals applied from a semiconductor inspecting apparatus to a semiconductor integrated circuit device.

Hereinafter, embodiments of the present invention will be described in detail with reference to the accompanying drawings. Note that the same or corresponding portions are denoted with the same reference numerals and characters throughout the figures, and detailed description thereof will not be repeated.

[First Embodiment]

Figure 1B:
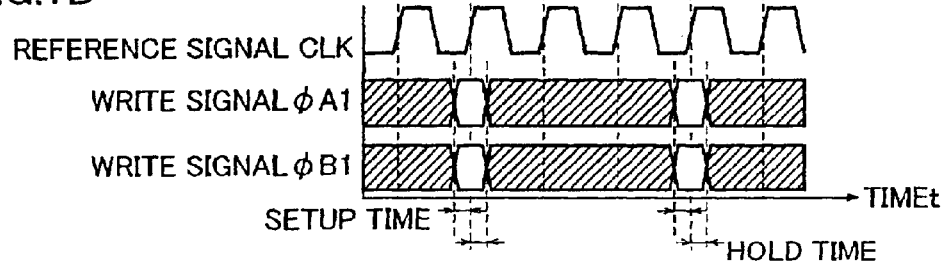
FIG. 1B is a timing chart of the write signals applied to a higher-frequency semiconductor integrated circuit device.

FIGS. 1A and 1B illustrate reduced AC parameter values in a higher-frequency synchronous semiconductor integrated circuit device. More specifically, FIGS. 1A and 1B are timing charts of the write signals that are transmitted from a semiconductor inspecting apparatus to a semiconductor integrated circuit device.

Referring to FIGS. 1A and 1B, as the frequency of the semiconductor integrated circuit device is increased, the frequency of the reference signal CLK of the semiconductor inspecting apparatus is also increased. As a result, the timing chart of the write signals φA1, φB1 changes from FIG. 1A to FIG. 2A. The setup time and hold time of the data that must be determined within the test rate are reduced.

Therefore, the write signals applied from the semiconductor inspecting apparatus must be accurately made in phase with each other at the input/output (I/O) pins of the semiconductor integrated circuit device. For example, in the case of the semiconductor integrated circuit device having the setup time of several hundreds of picoseconds or less according to the product standard, at least the semiconductor inspecting apparatus must have a skew accuracy of several tens of picoseconds for accurate inspection.

Figure 2A:
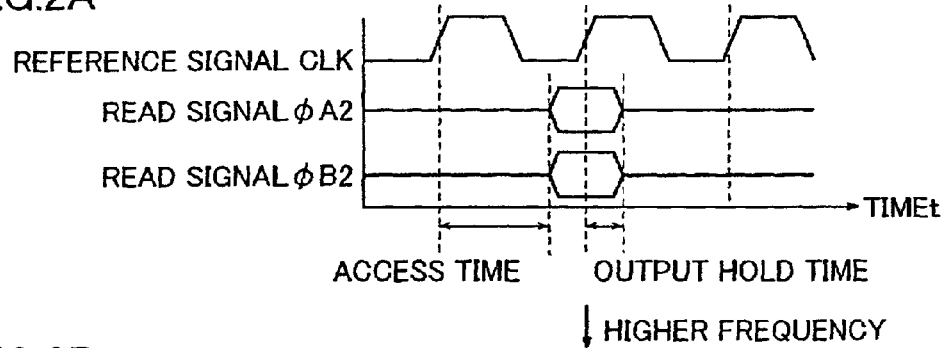
FIG. 2A is a timing chart of the read signals output from a semiconductor integrated circuit device to a semiconductor inspecting apparatus.
Figure 2B:
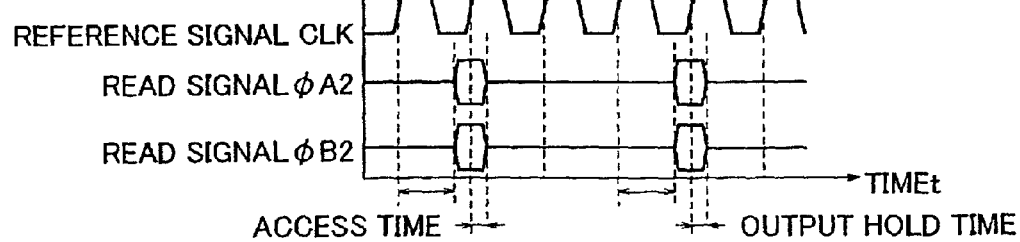
FIG. 2B is a timing chart of the read signals output from a higher-frequency semiconductor integrated circuit.

FIGS. 2A and 2B illustrate reduced AC parameter values in a higher-frequency synchronous semiconductor integrated circuit device. More specifically, FIGS. 2A and 2B are timing charts of the read signals that are transmitted from the semiconductor integrated circuit device to the semiconductor inspecting apparatus.

Referring to FIGS. 2A and 2B, with reduction in test rate, the timing chart of the read signals φA2, φB2 changes from FIG. 2A to FIG. 2B. Accordingly, the output hold time and access time of the data that is output from the semiconductor integrated circuit device are also reduced.

As a result, high skew accuracy is also required for the read signals that are output from the semiconductor integrated circuit device.

Figure 3:
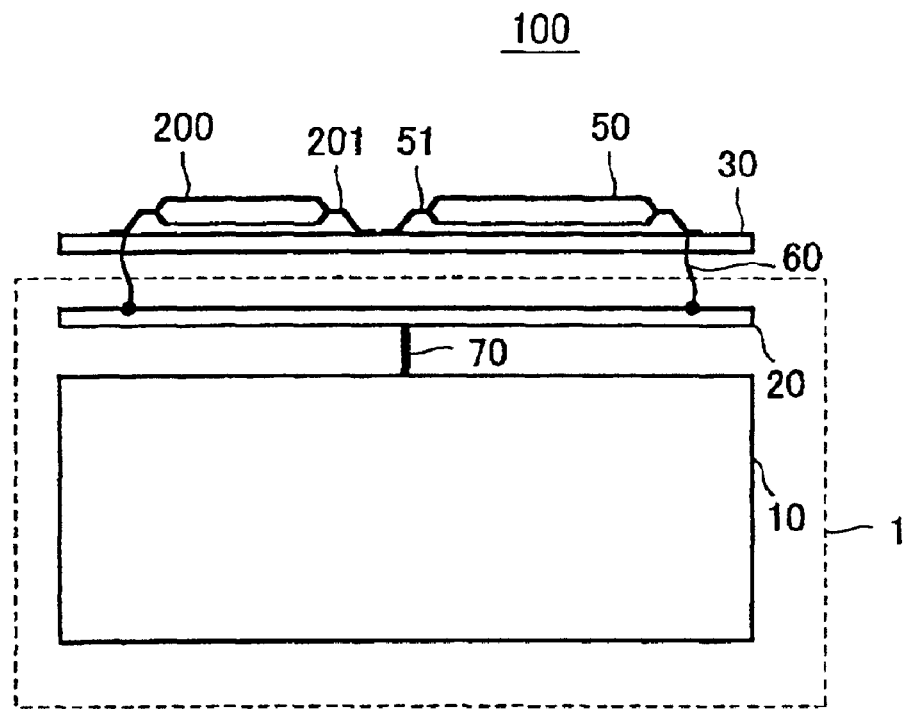
FIG. 3 is a block diagram showing the schematic structure of a semiconductor inspecting system according to a first embodiment of the present invention.

FIG. 3 is a block diagram showing the schematic structure of a semiconductor inspecting system according to the first embodiment of the present invention.

Referring to FIG. 3, the semiconductor inspecting system 100 includes a semiconductor inspecting apparatus 1, a socket board 30 and an auxiliary inspecting apparatus 200. The semiconductor inspecting apparatus 1 includes a main body 10 and a general-purpose board 20. Note that the main body 10 and the general-purpose board 20 are connected to each other though connectors 70.

The auxiliary inspecting apparatus 200 is mounted on the same socket board 30 as a device 50 to be inspected (hereinafter, referred to as inspected device 50). I/O pins 51 of the inspected device 50 are connected to corresponding I/O pins 201 of the auxiliary inspecting apparatus 200. Note that the socket board 30 and the general-purpose board 20 are connected to each other through coaxial cables 60.

Figure 4:
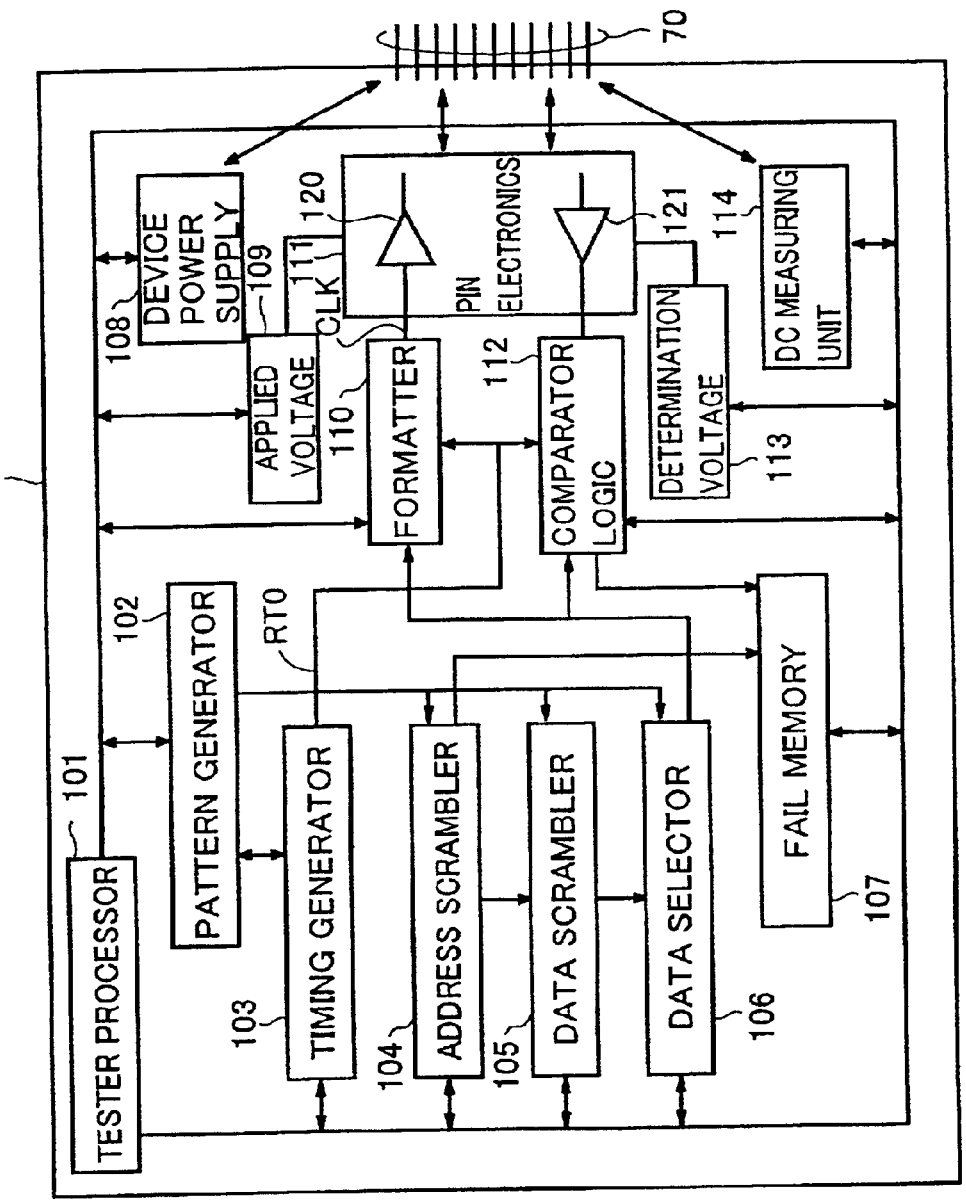
FIG. 4 is a block diagram showing the internal structure of a main body 10 of a semiconductor inspecting apparatus 1 in FIG. 3.

FIG. 4 is a block diagram showing the internal structure of the main body 10 of the semiconductor inspecting apparatus 1 in FIG. 3.

Referring to FIG. 4, the main body 10 includes a tester processor 101, a pattern generator 102, a timing generator 103, an address scrambler 104, a data scrambler 105, a data selector 106, a fail memory 107, a device power supply 108, an applied voltage 109, a formatter 110, pin electronics 111, a comparator logic 112, a determination voltage 113, and a DC (direct current) measuring unit 114.

The tester processor 101 is a computer developed exclusively for the semiconductor inspecting apparatus, and generally controls the main body 10. Note that the tester processor 101 stores the final determination result of the inspected device 50.

The timing generator 103 outputs a reference signal RT0 of the semiconductor inspecting apparatus. The reference signal RT0 determines the cycle time of semiconductor inspection. The timing generator 103 outputs a strobe signal to the comparator logic 112 described below simultaneously with the reference signal RT0.

The pattern generator 102 outputs preset programming data in synchronization with the reference signal RT0 output from the timing generator 103. The output data is applied to the formatter 110 and the comparator logic 112 through the address scrambler 104, the data scrambler 105 and the data selector 106. Hereinafter, the programming data thus output to the comparator logic is referred to as expected value pattern.

The address scrambler 104 converts address information in the programming data thus output from the pattern generator 102 into address information according to the cell arrangement in the inspected device 50.

The data scrambler 105 converts data information in the programming data thus output from the pattern generator 102, that is, information determining pulses, into data information according to the cell arrangement of the inspected device 50.

The data selector 106 receives the programming data output from the pattern generator 102, the address information output from the address scrambler 104, and the data information output from the data scrambler 105, and determines the address of the semiconductor integrated circuit device to which the data is to be allocated.

The formatter 110 receives the signal output from the data selector 106 and the reference signal RT0 output from the timing generator 103, and outputs a reference signal CLK and a write signal.

The pin electronics 111 includes a driver 120 for outputting the reference signal CLK and the write signal, and a comparator 121 for receiving a read signal from the inspected device 50.

The applied voltage 109 is connected to the driver 120 in the pin electronics 111. The driver 120 receives the applied voltage, and amplifies the write signal received from the formatter 110 to the voltage level that is set according to the applied voltage.

The determination voltage 113 is connected to the comparator 121 in the pin electronics 111. The comparator 121 receives the determination voltage, and determines whether or not the read signal from the inspected device 50 is higher than the H-Level voltage that is set according to the determination voltage or lower than the L-level voltage that is set according to the determination voltage. Note that the timing for comparison is determined by the strobe signal from the timing generator 103.

The device power supply 108 is a voltage source having a large current capacity, and is capable of setting a voltage according to the program. The device power supply 108 is used as a power supply for the inspected device 50.

The comparator logic 112 compares the expected value pattern output from the pattern generator 102 with a signal output from the comparator 121, and determines whether the read signal output from each I/O pin of the inspected semiconductor integrated circuit device corresponds to the expected value pattern or not.

The DC measuring unit 114 is a circuit formed from combination of an ammeter and a constant voltage source. The DC measuring unit 114 applies a voltage to the semiconductor integrated circuit device in order to measure a current value.

The fail memory 107 stores the determination result of the comparator logic 112, that is, the determination result about every I/O pin of the semiconductor integrated circuit device, according to the address information from the address scrambler 104.

Note that the determination result of whether the inspected device 50 is defective or not as a product is stored in a storage unit (not shown) in the tester processor 101.

Figure 5:
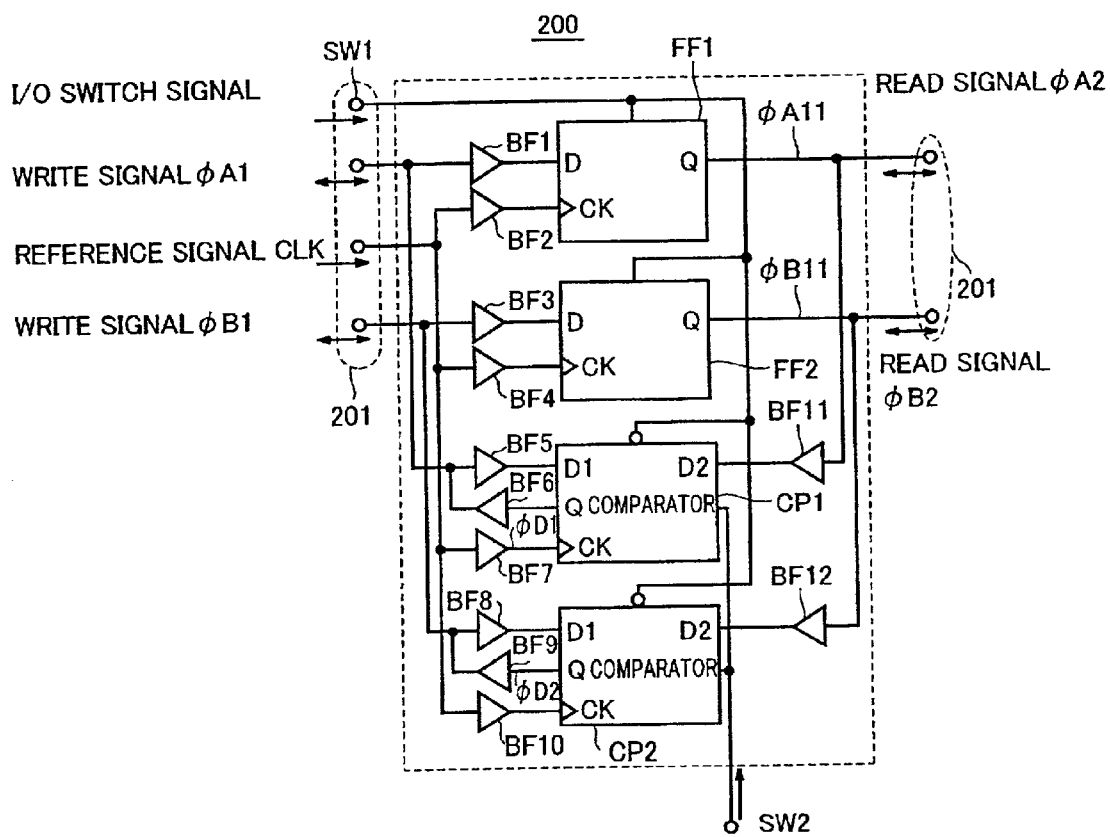
FIG. 5 is a circuit diagram showing the structure of an auxiliary inspecting apparatus 200 in FIG. 3.

FIG. 5 is a circuit diagram showing the structure of the auxiliary inspecting apparatus 200 in FIG. 3.

Referring to FIG. 5, the auxiliary inspecting apparatus 200 includes an I/O pin group 201, buffer circuits BF1 to BF12, flip-flops FF1, FF2, and comparators CP1, CP2.

An input/output (I/O) switch signal SW1 is applied from the I/O pin group 201 to the flip-flops FF1, FF2 and the comparators CP1, CP2. When a write signal is applied from the semiconductor inspecting apparatus 1 to the auxiliary inspecting apparatus 200, the flip-flops FF1, FF2 operate according to the I/O switch signal SW1. At this time, the comparators CP1, CP2 are stopped. When a signal is output from the inspected device 50 to the auxiliary inspecting apparatus 200, the comparators CP1, CP2 operate according the I/O switch signal SW1. At this time, the flip-flops FF1, FF2 are stopped.

A determination result output signal SW2 is also applied to the comparators CP1, CP2.

The flip-flop FF1 receives the write signal $\phi$A1 and the reference signal CLK from the semiconductor inspecting apparatus 1 through the buffers BF1, BF2, respectively. The flip-flop FF1 outputs the write signal $\phi$A1 in synchronization with the reference signal CLK as a write signal $\phi$A11. The flip-flop FF1 thus outputs the write signal $\phi$A11 to the inspected device 50.

The flip-flop FF2 receives the write signal $\phi$B1 and the reference signal CLK from the semiconductor inspecting apparatus 1 through the buffers BF3, BF4, respectively. The flip-flop FF2 outputs the write signal $\phi$B1 in synchronization with the reference signal CLK as a write signal $\phi$B11. The flip-flop FF2 thus outputs the write signal $\phi$B11 to the inspected device 50.

The flip-flops FF1, FF2 thus function as a timing adjusting circuit for the write signals $\phi$A1, $\phi$B1, respectively.

The comparator CP1 receives the write signal $\phi$A1 through the buffer BF5, and also receives the read signal $\phi$A2 from the inspected device 50 through the buffer BF11. The comparator CP1 compares the write signal $\phi$A1 with the read signal $\phi$A2 at the trigger timing of the reference signal CLK received through the buffer BF7. If the write signal $\phi$A1 does not match the read signal $\phi$A2, the comparator CP1 outputs a determination signal $\phi$D1 to the semiconductor inspecting apparatus 1 through the buffer BF6. Note that the determination signal $\phi$D1 is output in response to activation of the determination result output signal SW2.

The comparator CP2 receives the write signal $\phi$B1 through the buffer BF8, and also receives the read signal $\phi$B2 from the inspected device 50 through the buffer BF12. The comparator CP2 compares the write signal $\phi$B1 with the read signal $\phi$B2 at the trigger timing of the reference signal CLK received through the buffer BF10. If the write signal $\phi$B1 does not match the read signal $\phi$B2, the comparator CP2 outputs a determination signal $\phi$D2 to the semiconductor inspecting apparatus 1 through the buffer BF9. Note that, like the determination signal $\phi$D1, the determination signal $\phi$D2 is output in response to activation of the determination result output signal SW2.

Note that the structure of the auxiliary inspecting apparatus 200 handling two write signals has been described in connection with FIG. 5. However, the auxiliary inspecting apparatus handling two or more write signals would include flip-flops and comparators corresponding to the number of write signals.

According to the semiconductor inspecting apparatus 1 and the auxiliary inspecting apparatus 200 having such a structure, the auxiliary inspecting apparatus 200 is mounted on the same socket board 30 as the inspected device 50.

Hereinafter, operation of the semiconductor inspecting system 100 will be described.

Figure 6A:
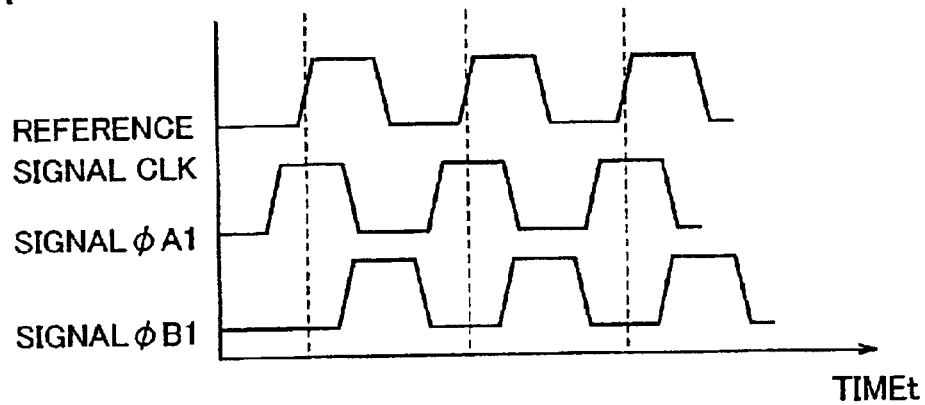
FIG. 6A is a timing chart of the write signals applied to the auxiliary inspecting apparatus.
Figure 6B:
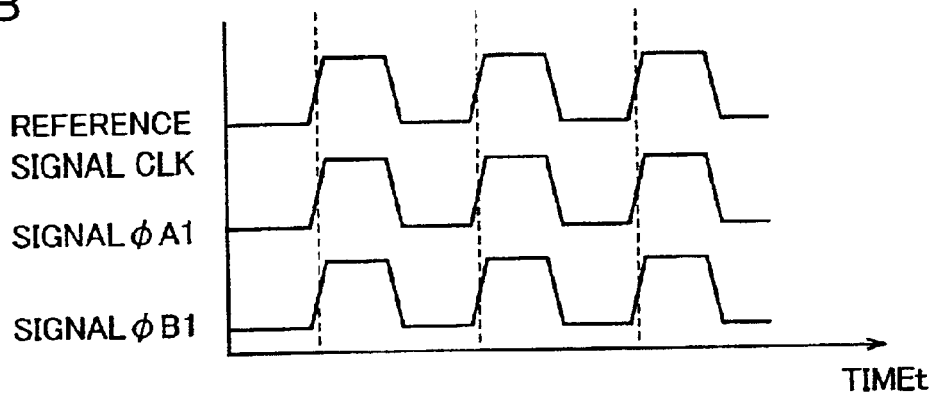
FIG. 6B is a timing chart of the write signals output from the auxiliary inspecting apparatus.

FIG. 6A is a timing chart of the write signals applied to the auxiliary inspecting apparatus 200, and FIG. 6B is a timing chart of the write signals output from the auxiliary inspecting apparatus 200.

Referring to FIG. 6A, the write signals $\phi$A1, $\phi$B1 and the reference signal CLK output from the semiconductor inspecting apparatus 1 are affected by the impedance of the pattern wirings on the general-purpose board 20 and the socket board 30 and the impedance of the coaxial cables 60. Accordingly, the write signals $\phi$A1, $\phi$B1 and the reference signal CLK are applied to the auxiliary inspecting apparatus 200 at different timings.

The write signals $\phi$A1, $\phi$B1 applied to the auxiliary inspecting apparatus 200 are synchronized with the reference signal CLK in the flip-flops FF1, FF2. As a result, the write signals $\phi$A1, $\phi$B1 are again synchronized with the reference signal CLK when being output from the auxiliary inspecting apparatus 200 as shown in FIG. 6B. The difference in timing between the write signals $\phi$A1, $\phi$B1 and the reference signal CLK to be applied to the inspected device 50 is thus suppressed.

When the read signals $\phi$A2, $\phi$B2 output from the inspected device 50 are determined in the comparator logic 112 of the semiconductor inspecting apparatus 1, they are affected by the impedance of the coaxial cables 60 connecting the inspected device 50 to the semiconductor inspecting apparatus 1 and the impedance of the pattern wirings. This may possibly hinder accurate determination of the semiconductor inspecting apparatus 1. Accordingly, the auxiliary inspecting apparatus 200 determines the read signals $\phi$A2, $\phi$B2 in the comparators CP1, CP2, and outputs the determination result to the semiconductor inspecting apparatus 1. This allows for a more accurate inspection result about the inspected device 50.

Thus, providing the auxiliary inspecting apparatus on the same socket board as the inspected device facilitates accurate timing adjustment of the write signals.

[Second Embodiment]

In the first embodiment, the write signals are adjusted in timing within the auxiliary inspecting apparatus 200.

However, in order to adjust the timing of the write signals more accurately, it is desirable to generate the write signals from the auxiliary inspecting apparatus itself.

Figure 7:
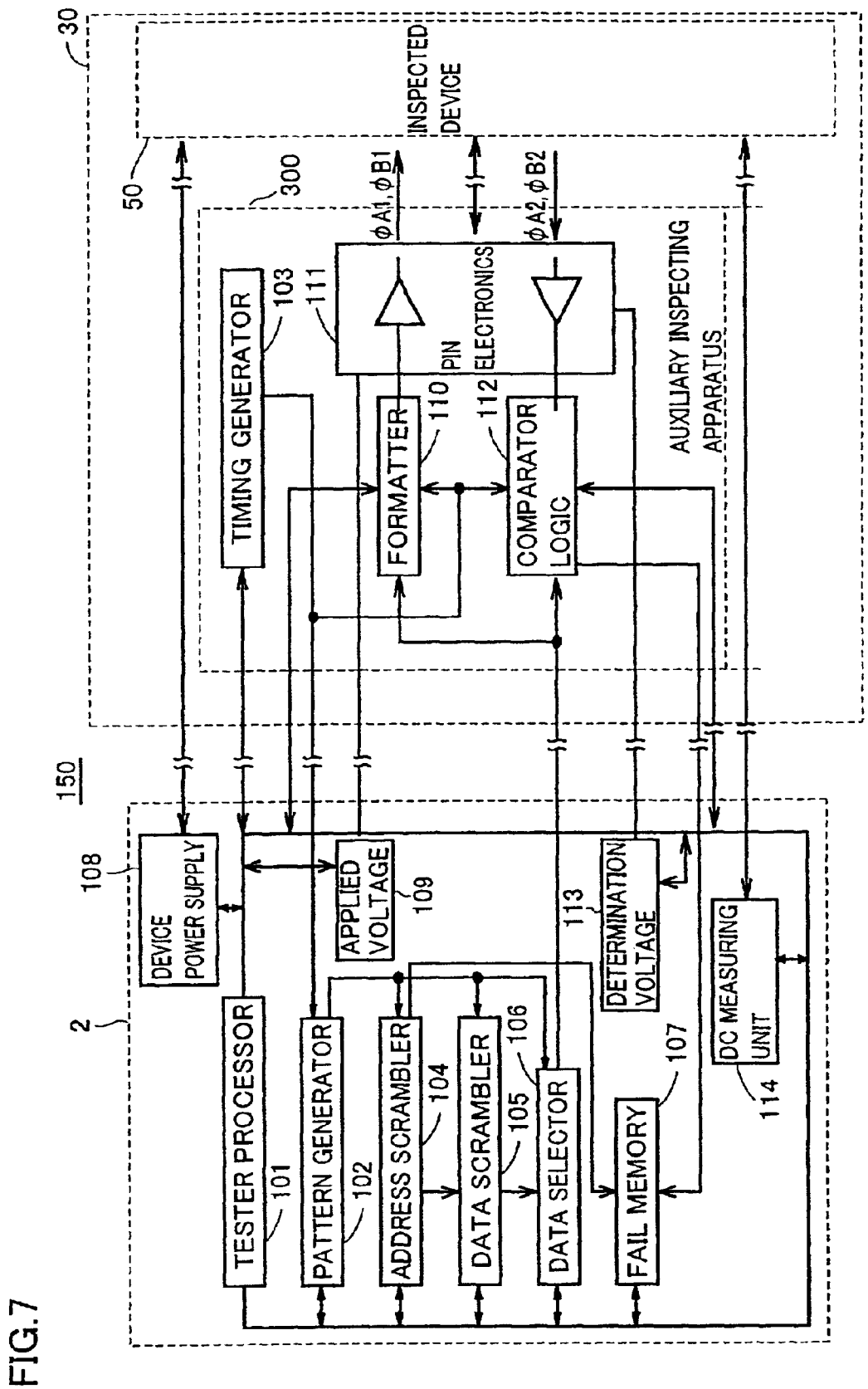
FIG. 7 is a block diagram showing the schematic structure of a semiconductor inspecting system according to a second embodiment of the present invention.

FIG. 7 is a block diagram showing the schematic configuration of a semiconductor inspecting system according to the second embodiment of the present invention.

Referring to FIG. 7, in the semiconductor inspecting system 150 of the second embodiment, the semiconductor inspecting apparatus 1 and the auxiliary inspecting apparatus 200 of the semiconductor inspecting system 100 are replaced with a semiconductor inspecting apparatus 2 and an auxiliary inspecting apparatus 300.

Like the auxiliary inspecting apparatus 200 of the semiconductor inspecting system 100 in FIG. 3, the auxiliary inspecting apparatus 300 is mounted on the same socket board 30 as the inspected device 50.

The auxiliary inspecting apparatus 300 includes a timing generator 103, a formatter 110, pin electronics 111, and a comparator 112.

Since each block circuit has the same function as that of the corresponding block circuit in FIG. 4, description thereof will not be repeated.

The semiconductor inspecting apparatus 2 includes a tester processor 101, a pattern generator 102, an address scrambler 104, a data scrambler 105, a data selector 106, a fail memory 107, a device power supply 108, an applied voltage 109, a determination voltage 113, and a DC measuring unit 114.

Since each block circuit has the same function as that of the corresponding block circuit in FIG. 4, description thereof will not be repeated.

Like the semiconductor inspecting apparatus 1 of FIG. 3, the semiconductor inspecting apparatus 2 includes a general-purpose board 20 and coaxial cables 60, although not shown in the figure. The semiconductor inspecting apparatus 2 and the auxiliary inspecting apparatus 300 are connected to each other through the connectors 70, general-purpose board 20, coaxial cables 60, and socket board 30 like in FIG. 3.

Figure 8:
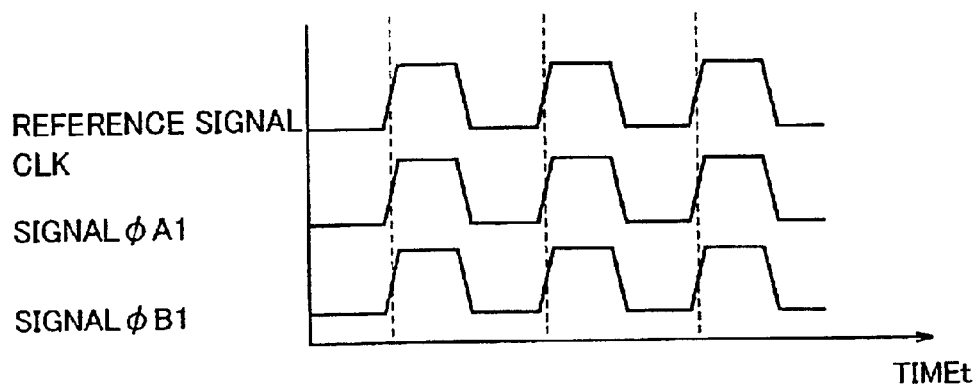
FIG. 8 is a timing chart of the write signals in the case where a device is inspected using the semiconductor inspecting system 150.

FIG. 8 is a timing chart of the write signals in the case where the device 50 is inspected using the semiconductor inspecting system 150.

Referring to FIG. 8, write signals φA1, φB1 and a reference signal CLK are produced within the auxiliary inspecting apparatus 30. Therefore, the write signals φA1, φB1 and the reference signal CLK need not be adjusted in timing. The difference in timing is suppressed even when the auxiliary inspecting apparatus 300 outputs the write signals φA1, φB1 and the reference signal CLK to the inspected device 50. As a result, the write signals φA1, φB1 are output to the inspected device 50 at the same timing.

The auxiliary inspecting apparatus 300 includes the comparator 112. Therefore, the read signals φA2, φB2 output from the inspected device 50 can be determined within the auxiliary inspecting apparatus 300. This enables more accurate determination of the inspection result by the semiconductor inspecting system 150.

In the semiconductor inspecting system 150 of the second embodiment, generation of the write signals and determination of the read signals are conducted within the auxiliary inspecting apparatus 300, simplifying the structure of the semiconductor inspecting apparatus as compared to the semiconductor inspecting system 100 of the first embodiment. In other words, in the semiconductor inspecting system 150, the structure for producing the write signals, such as a timing generator and a formatter, need not be provided in the semiconductor inspecting apparatus. The comparator for determining the read signals is not required, either.

It should be appreciated that it is also possible to inspect the device 50 using the semiconductor inspecting apparatus 1 and the auxiliary inspecting apparatus 300. In this case, the timing generator 103, the formatter 110 and the comparator 112 in the semiconductor inspecting apparatus 1 do not function.

The auxiliary inspecting apparatus may alternatively include all block circuits but the power supply system within the semiconductor inspecting apparatus 1.

[Third Embodiment]

In the first and second embodiments, the inspected apparatus and the auxiliary inspecting apparatus are mounted on the same surface of the same socket board. However, this requires the I/O pins of the inspected device to be connected to the I/O pins of the auxiliary inspecting apparatus through the pattern wirings. Accordingly, the timing of the write signals and the read signals is affected by the impedance of the pattern wirings, generating the delay difference between a plurality of write signals or between a plurality of read signals. In order to suppress the delay difference between the signals due to the pattern wiring length, it is more desirable to mount the inspected device and the auxiliary inspecting apparatus closer to each other.

Figure 9:
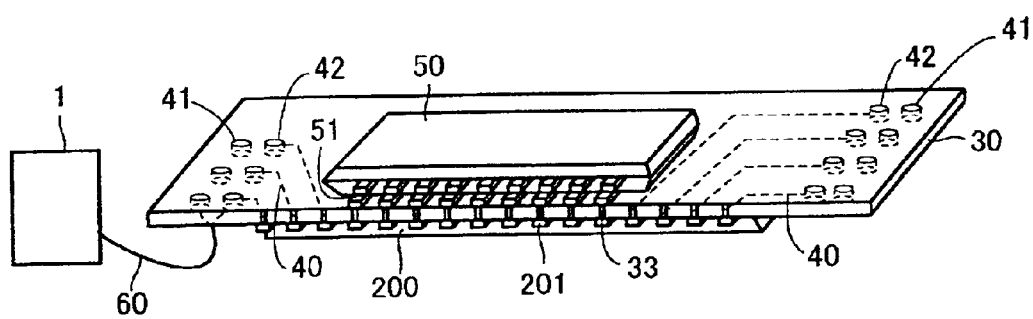
FIG. 9 is a schematic diagram illustrating a method for mounting on a socket board an auxiliary inspecting apparatus and a device to be inspected, according to a third embodiment of the present invention.

FIG. 9 is a schematic diagram illustrating a method for mounting the auxiliary inspecting apparatus and the inspected device on the socket board according to the third embodiment of the present invention.

Referring to FIG. 9, the inspected device 50 and the auxiliary inspecting apparatus 200 are both sealed with a TSOP (thin small outline package) or a QFP (quad flat package). The I/O pins 51 of the inspected device 50 are arranged at the same pin pitch as that of the I/O pins 201 of the auxiliary inspecting apparatus 200.

The inspected device 50 is mounted on one surface of the socket board 30. The auxiliary inspecting apparatus 200 is mounted on the other surface of the socket board 30. The I/O pins 51 of the inspected device 50, are connected to the corresponding I/O pins 201 of the auxiliary inspecting apparatus 200 via through holes 33 in the socket board 30 on a one-to-one basis. The I/O pins 201 of the auxiliary inspecting apparatus 200 corresponding to the I/O pins 51 of the inspected device 51 which need not be adjusted are connected to the semiconductor inspecting apparatus 1 through a cable 60, coaxial signal holes 42, and coaxial GND holes 41.

Such connection between the inspected device 50 and the auxiliary inspecting apparatus 200 requires no pattern wiring for connecting the I/O pins 51 of the inspected device 50 with the I/O pins 201 of the auxiliary inspecting apparatus 200. Accordingly, there is only a negligible delay difference between the signals resulting from the impedance of the wirings between the I/O pins 51 of the inspected device 50 and the I/O pins 201 of the auxiliary inspecting apparatus 200. This enables more accurate inspection.

Figure 10:
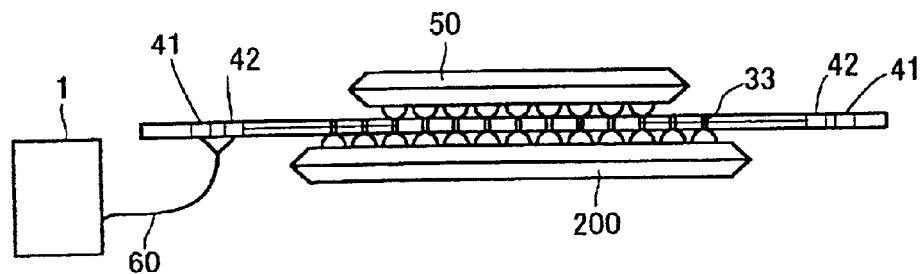
FIG. 10 is a schematic diagram illustrating another method for installing on a socket board an auxiliary inspecting apparatus and an inspected device according to the third embodiment of the present invention.

FIG. 10 is a schematic diagram illustrating another method for mounting the auxiliary inspecting apparatus and the inspected device on the socket board according to the third embodiment of the present invention.

Referring to FIG. 10, the inspected device 50 and the auxiliary inspecting apparatus 200 are both sealed with a BGA (ball grid array) package or a CSP (chip size package). The soldering ball arrangement of the inspected device 50 is herein the same as that of the auxiliary inspecting apparatus 200.

The inspected device 50 is mounted on one surface of the socket board 30. The auxiliary inspecting apparatus 200 is mounted on the other surface of the socket board 30. The soldering balls of the inspected device 50 are connected to the corresponding soldering balls of the auxiliary inspecting apparatus 200 via through holes 33 in the socket board 30 on a one-to-one basis. The soldering balls of the auxiliary inspecting apparatus 200 corresponding to the soldering balls of the inspected device 51 which need not be adjusted are connected to the semiconductor inspecting apparatus 1 through a coaxial cable 60, coaxial signal holes 42, and coaxial GND holes 41.

Thus, even when the inspected device and the auxiliary inspecting apparatus are both sealed with a BGA package or a CSP, the signal delay difference due to the wiring length can be suppressed by reducing the wiring pattern length as much as possible.

Note that, in order to facilitate replacement of the inspected device 50 and the auxiliary inspecting apparatus 200, it is more desirable for the inspected device 50 and the auxiliary inspecting apparatus 200 to be detachable from the socket board.

Figure 11:
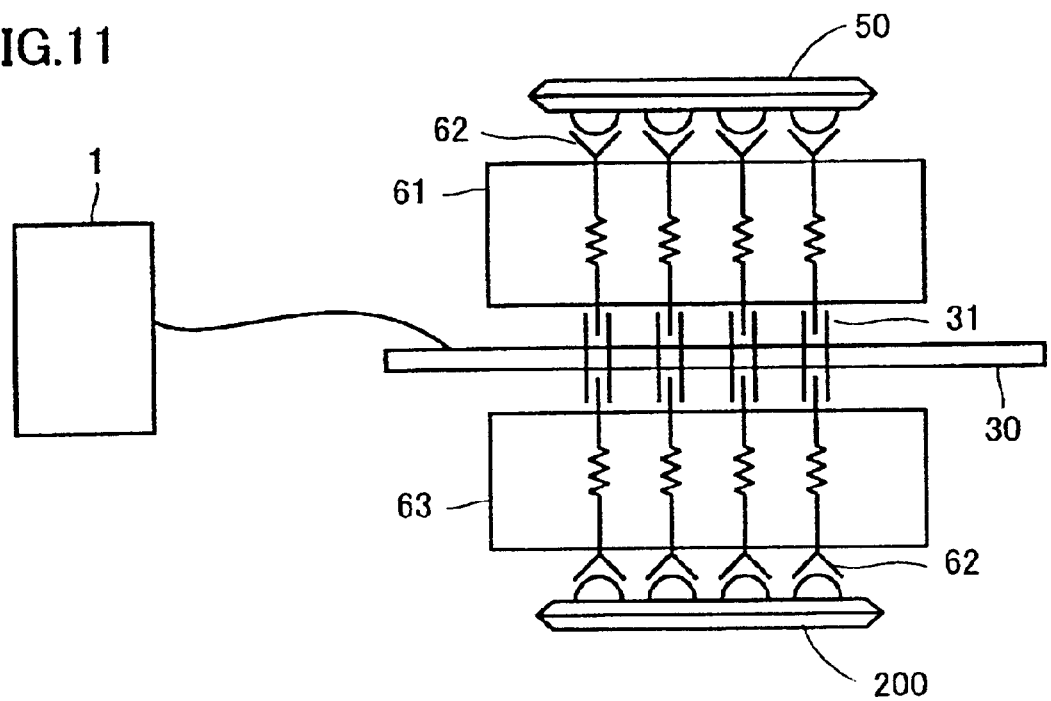
FIG. 11 is a schematic diagram illustrating the state in which the device 50 to be inspected and the auxiliary inspecting apparatus 200 are mounted on the socket board 30.

FIG. 11 is a schematic diagram illustrating the state in which the inspected device 50 and the auxiliary inspecting apparatus 200 are mounted on the socket board 30.

Referring to FIG. 11, the inspected device 50 is connected to the socket board 30 through an IC socket 61. The IC socket 61 includes a plurality of leads 62 arranged corresponding to the soldering ball arrangement of the inspected device 50. The leads 62 connect pin sockets 31 of the socket board 30 with the soldering balls of the inspected device 50. Note that the leads 62 include a spring, so that the inspected device 50 is detachable from the socket board 30. This facilitates replacement of the inspected device 50.

Similarly, the auxiliary inspecting apparatus 200 is connected to the socket board 30 through an IC socket 63. Accordingly, the auxiliary inspecting apparatus 200 can be easily replaced even in the case of a failure.

Although the semiconductor inspecting system of the third embodiment described above uses the semiconductor inspecting apparatus 1 and the auxiliary inspecting apparatus 200, the semiconductor inspecting apparatus 2 and the auxiliary inspecting apparatus 300 may be used. Alternatively, the semiconductor inspecting apparatus 1 and the auxiliary inspecting apparatus 300 may be used.

[Fourth Embodiment]

Figure 12:
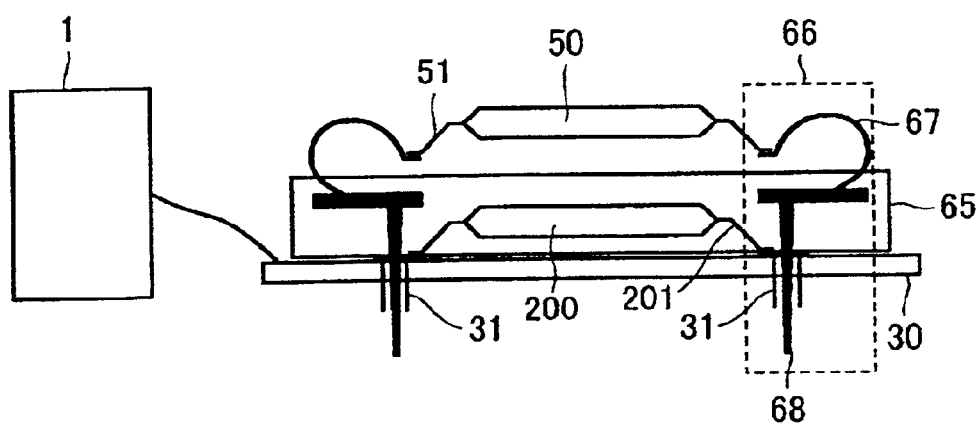
FIG. 12 is a schematic diagram showing the structure of an auxiliary inspecting apparatus mounted on the same socket board as an inspected device in a semiconductor inspecting system according to a fourth embodiment of the present invention.

FIG. 12 is a schematic diagram showing the configuration of an auxiliary inspecting apparatus that is mounted on the same socket board as an inspected device in a semiconductor inspecting system according to the fourth embodiment of the present invention.

Referring to FIG. 12, the inspected device 50 is connected to the socket board 30 through an IC socket 65. The IC socket 65 includes an auxiliary inspecting apparatus 200 and a plurality of leads 66. The leads 66 are each formed from a spring 67 and a lower terminal 68. The lower terminal 68 is connected to the spring 67. Each lower terminal 68 is connected to the corresponding I/O pin 201 of the auxiliary inspecting apparatus 200, and has its tip projecting from the socket body and inserted into a corresponding pin socket 31 of the socket board 30. The spring 67 has its one end connected to the lower terminal 68 within the socket body, and the other end projecting from the socket body. With the I/O pins 51 of the inspected device 50 pressing the springs 67 of the leads 66, the springs 67 reliably connect the I/O pins 51 of the inspected device 50 with the socket board 30 against the pressing force. Since the leads 66 are respectively connected to the I/O pins 201 of the auxiliary inspecting apparatus 200, the I/O pins 51 of the inspected device 50 are connected to the corresponding I/O pins 201 of the auxiliary inspecting apparatus 200.

The use of such an IC socket 65 facilitates replacement of the inspected device 50. Moreover, if the auxiliary inspecting apparatus 200 fails, the IC socket 65 including the auxiliary inspecting apparatus 200 is replaced. This also facilitates replacement of the auxiliary inspecting apparatus 200.

Note that the auxiliary inspecting apparatus 300 may be included in the IC socket 65 instead of the auxiliary inspecting apparatus 200.

[Fifth Embodiment]

The auxiliary inspecting apparatus 200 or 300 described in the first to third embodiments may be used as a special circuit device. However, the auxiliary inspecting apparatus may alternatively be provided as a test mode circuit or a TEG (test element group) circuit within a semiconductor integrated circuit device resulting in a product so as to be sealed with the same package as the semiconductor integrated circuit.

Figure 13:
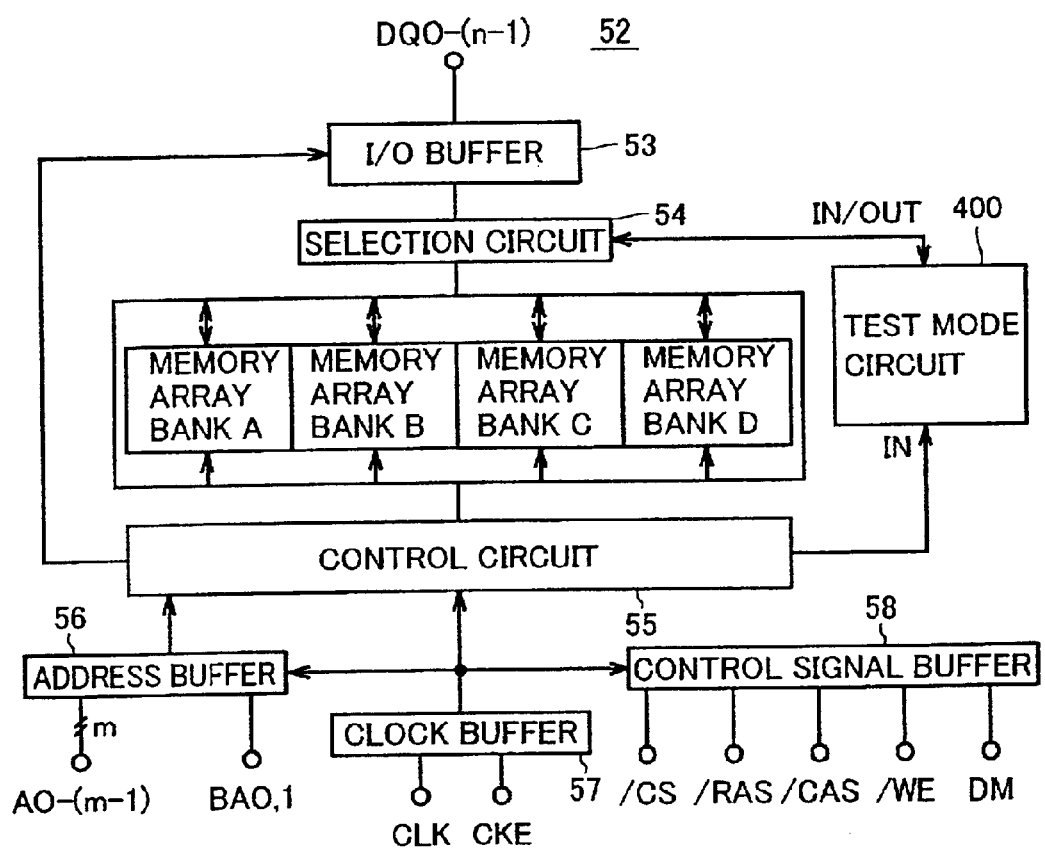
FIG. 13 is a block diagram showing the structure of a semiconductor integrated circuit device including an auxiliary inspecting circuit according to a fifth embodiment of the present invention.

FIG. 13 is a block diagram showing the configuration of a semiconductor integrated circuit device including an auxiliary inspecting circuit according to the fifth embodiment of the present invention.

Referring to FIG. 13, the semiconductor integrated circuit device 52 includes an input/output (I/O) buffer 53, memory array banks A to D each having a plurality of memory cells arranged in a matrix, a clock buffer 57, a control signal buffer 58, a control circuit 55 and a test mode circuit 400.

An address buffer 56 produces a row address signal and a column address signal based on an external address signal A0 to Am−1 (where m is an integer) and an internal bank address signal int.BA0, int.BA1 for output to the control circuit 55.

The clock buffer 57 produces an internal clock signal int.CLK based on an external clock signal ext.CLK and a clock activation signal CKE for output to the control circuit 55.

The control signal buffer 58 produces an internal control signal based on an external control signal /CS, /RAS, /CAS, /WE, DM for output to the control circuit 55.

In response to the signals from the address buffer 56, the clock buffer 57 and the control signal buffer 58, the control circuit 55 selects a prescribed operation mode to generally control the semiconductor integrated circuit device 52.

The I/O buffer 53 applies the received external data DQ0 to DQn−1 (where n is an integer) to the memory cell in the selected memory array bank in response to a control signal. The I/O buffer 53 also externally outputs the read data from the memory cell in the selected memory array bank in response to a control signal.

A selection circuit 54 determines whether the semiconductor integrated circuit device 52 is used in the normal mode or the test mode. Note that the normal mode is a mode in which the semiconductor integrated circuit device 52 is used as a semiconductor integrated circuit device, and the test mode is a mode in which the semiconductor integrated circuit device 52 is used as an auxiliary inspecting apparatus.

The test mode circuit 400 operates when the semiconductor integrated circuit device 52 is used as an auxiliary inspecting apparatus. The test mode circuit 400 may have the same structure as that of the auxiliary inspecting apparatus 200 in FIG. 5, or may have the same structure as that of the auxiliary inspecting apparatus 300 in FIG. 7.

Operation of the semiconductor integrated circuit device 52 having the circuit structure described above will now be described.

In the case where the semiconductor integrated circuit device 52 is operated as a semiconductor integrated circuit device, the selection circuit 54 disables functioning of the test mode circuit 400. Accordingly, the semiconductor integrated circuit device 52 operates in the same manner as that of the normal semiconductor integrated circuit device 50.

In the case where the semiconductor integrated circuit device 52 is operated as an auxiliary inspecting apparatus, the selection circuit 54 disables functioning as a semiconductor integrated circuit device, and the test mode circuit 400 is operated.

By replacing the auxiliary inspecting apparatus 200 in the semiconductor inspecting system of FIG. 3 with the semiconductor integrated circuit device 52, the semiconductor integrated circuit device 52 functions as an auxiliary inspecting apparatus. Accordingly, the semiconductor integrated circuit device 50 can be inspected using the semiconductor inspecting apparatus 1 and the semiconductor integrated circuit device 52.

Similarly, by replacing the auxiliary inspecting apparatus 300 of FIG. 7 with the semiconductor integrated circuit device 52, the semiconductor integrated circuit device 52 functions as an auxiliary inspecting apparatus.

As has been described above, in the fifth embodiment, the test mode circuit functioning as an auxiliary inspecting apparatus is included in advance in the fabricated semiconductor integrated circuit device. This enables one of a plurality of fabricated semiconductor integrated circuit devices to be used as an auxiliary inspecting apparatus even if the standard of the semiconductor integrated circuit devices is changed. This eliminates the need to fabricate an additional auxiliary inspecting apparatus having the same pin pitch as that of the semiconductor integrated circuit device every time the standard of the semiconductor integrated circuit devices is changed.

[Sixth Embodiment]

Figure 14:
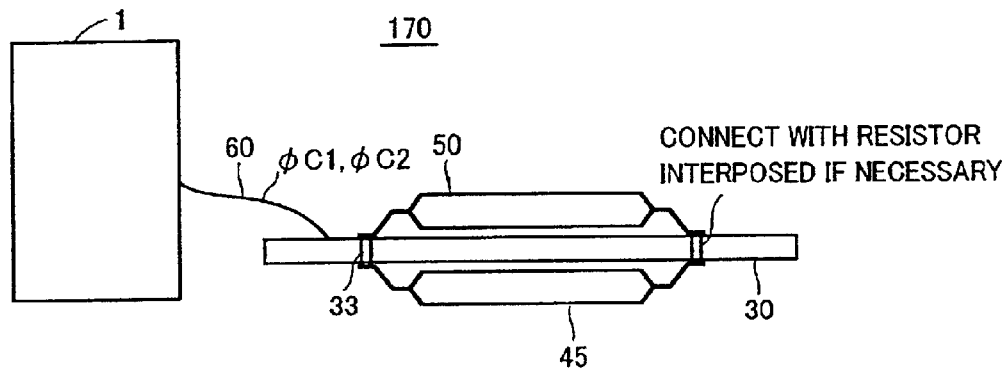
FIG. 14 is a schematic diagram showing the structure of a semiconductor inspecting system 170 according to a sixth embodiment of the present invention.

FIG. 14 is a schematic diagram showing the structure of a semiconductor inspecting system 170 according to the sixth embodiment of the present invention.

Referring to FIG. 14, the semiconductor inspecting system 170 includes a semiconductor inspecting apparatus 1, a reference sample 45 and a socket board 30. The reference sample 45 is a semiconductor integrated circuit device having the same specification as that of the inspected device 50, and having been determined as non-defective by inspection.

The inspected device 50 is mounted on one surface of the socket board 30. The reference sample 45 is mounted on the other surface of the socket board 30. The I/O pins of the inspected device 50 are connected to the corresponding I/O pins of the reference sample 45 via through holes 33 in the socket board 30 on a one-to-one basis, and if necessary, through resistive elements (not shown).

Since the circuit structure is otherwise the same as that of FIG. 3, description thereof will not be repeated.

Here, the semiconductor inspecting apparatus outputs a write signal. The inspected device 50 outputs a read signal $\phi C1$ in response to the write signal. The reference sample 45 outputs a read signal $\phi C2$ in response to the write signal.

Operation of the semiconductor inspecting system 170 having such a structure will now be described.

Figure 15A:
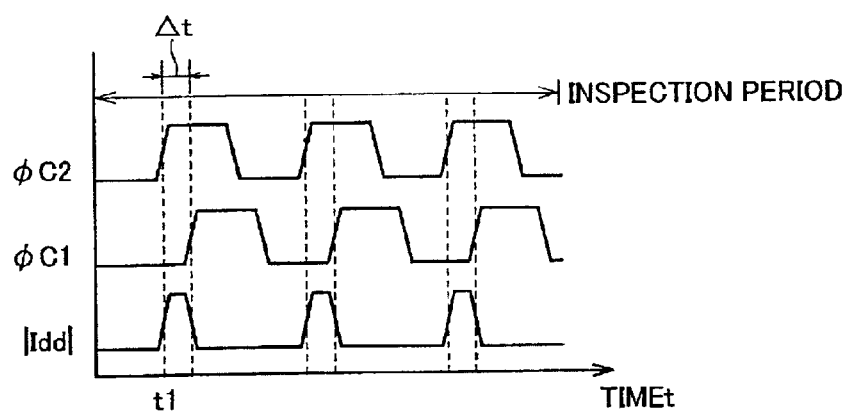
FIG. 15A is an example of a timing chart showing the relation between a read signal of an inspected device 50, a read signal of a reference sample 45 and a power supply current during inspection by the semiconductor inspecting system 170.
Figure 15B:
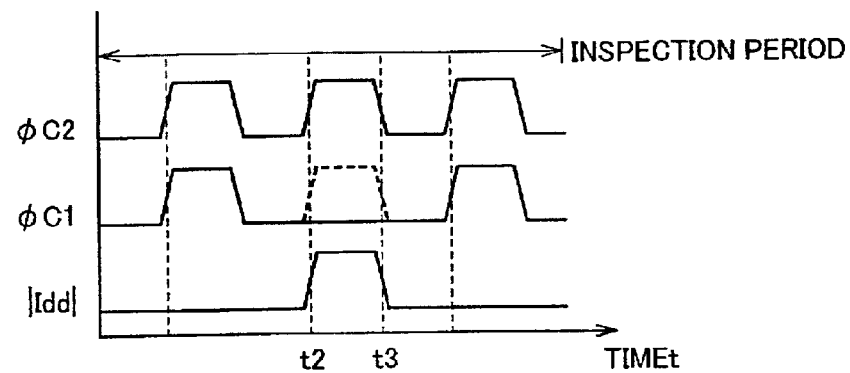
FIG. 15B is another example of the timing chart showing the relation between a read signal of an inspected device 50, a read signal of a reference sample 45 and a power supply current during inspection by the semiconductor inspecting system 170.
Figure 16:
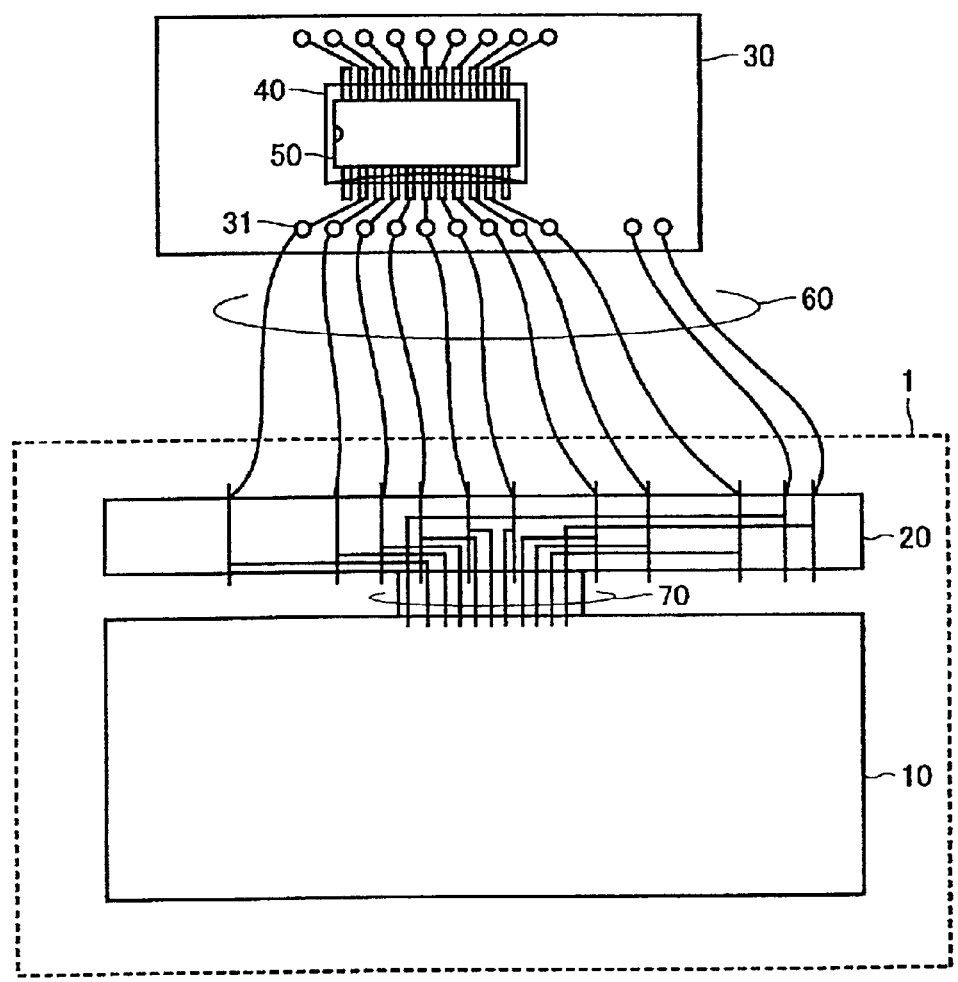
FIG. 16 is a block diagram showing the schematic structure of a conventional semiconductor inspecting apparatus.

FIGS. 15A and 15B are timing charts showing the relation between a read signal of the inspected device 50, a read signal of the reference sample 45 and a power supply current during inspection by the semiconductor inspecting system 170.

Referring to FIG. 15A, a write signal from the main body 10 of the semiconductor inspecting apparatus 1 is applied to the inspected device 50 and the reference sample 45 at the same timing. The inspected device 50 outputs a read signal $\phi C1$ in response to the write signal. Similarly, the reference sample 45 outputs a read signal $\phi C2$ in response to the write signal. Provided that the read signals $\phi C1$ and $\phi 2$ are out of phase by time At, the read signal $\phi C2$ is at H level whereas the read signal $\phi C1$ is at L level at time t1. Thus, a power supply current Idd flows from the reference sample 45 to the inspected device 50. Similarly, referring to FIG. 15B, the read signal $\phi C2$ is at H level whereas the read signal $\phi C1$ is at L level during the period from time t2 to time t3. Accordingly, a power supply current Idd flows from the reference sample 45 to the inspected device 50 during this period.

In the semiconductor inspecting apparatus 1, the DC measuring unit 114 in the main body 10 measures a power supply current |Idd| flowing in response to the write signal, and the tester processor 101 calculates an average value of the power supply current |Idd|.

Whether the inspected device 50 is defective or not is determined based on the average value of the power supply current |Idd| thus calculated.

The use of the semiconductor integrated circuit device having the same specification as that of the inspected device and having been determined as non-defective by inspection as a reference sample eliminates the need for the auxiliary inspecting apparatus as described in the first to fifth embodiments. Accordingly, accurate inspection can be conducted in a more simplified manner.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor inspecting system inspecting a semiconductor integrated circuit device, comprising:
   a semiconductor inspecting apparatus;
   a socket board mounting said semiconductor integrated circuit device thereon for inspection; and
   an auxiliary inspecting apparatus mounted on said socket board, said auxiliary inspecting apparatus including
      a receiving circuit for receiving a plurality of write signals from said semiconductor inspecting apparatus,
      a timing adjustment circuit for adjusting timing of said plurality of write signals,
      an output circuit for outputting said write signals adjusted by said timing adjustment circuit to said semiconductor integrated circuit device, and
      input/output terminals for receiving and outputting said write signals.

2. The semiconductor inspecting system according to claim 1, wherein said auxiliary inspecting apparatus further includes a determination circuit for determining whether a signal output from said semiconductor integrated circuit device in response to each write signal is a prescribed signal or not.

3. The semiconductor inspecting system according to claim 1, wherein said auxiliary inspecting apparatus is included in another semiconductor integrated circuit device having a same specification as that of said semiconductor integrated circuit device.

4. The semiconductor inspecting system according to claim 1, further comprising an IC (integrated circuit) socket, wherein
   said auxiliary inspecting apparatus is included in said IC socket,
   said IC socket includes a spring enabling electric connection between said I/O terminal of said auxiliary inspecting apparatus and corresponding I/O terminals of said semiconductor integrated circuit device, and
   said semiconductor integrated circuit device is connected to said socket board through said IC socket.

5. A semiconductor inspecting system inspecting a semiconductor integrated circuit device, comprising:
- a semiconductor inspecting apparatus;
- a socket board mounting said semiconductor integrated circuit device thereon for inspection; and
- an auxiliary inspecting apparatus mounted on said socket board, said auxiliary inspecting apparatus including
  - write signal generator for generating a plurality of write signals based on a logic pattern from said semiconductor inspecting apparatus,
  - a determination circuit for determining whether a signal output from said semiconductor integrated circuit device in response to each write signal is a prescribed signal or not, and
  - an input/output (I/O) circuit for outputting said write signals to said semiconductor integrated circuit device, outputting the determination result of said determination circuit to said semiconductor inspecting apparatus, and receiving said signals output from said semiconductor integrated circuit device.

6. A semiconductor inspecting method inspecting a semiconductor integrated circuit device using a semiconductor inspecting system including a semiconductor inspecting apparatus and an auxiliary inspecting apparatus, comprising the steps of:
- mounting said auxiliary inspecting apparatus and said semiconductor integrated circuit device on a same socket board;
- outputting a plurality of write signals from said semiconductor inspecting apparatus to said auxiliary inspecting apparatus;
- adjusting timing of said plurality of write signals by said auxiliary inspecting apparatus; and
- receiving said adjusted signals by said semiconductor integrated circuit device.

7. The semiconductor inspecting method according to claim 6, further comprising the steps of:
- outputting a signal from said semiconductor integrated circuit device in response to each write signal;
- receiving said signal from said semiconductor integrated circuit device by said auxiliary inspecting apparatus; and
- determining by said auxiliary inspecting apparatus whether said signal output from said semiconductor integrated circuit device is a prescribed signal or not.

8. The semiconductor inspecting method according to claim 6, wherein said step of mounting said auxiliary inspecting apparatus and said semiconductor integrated circuit device on the same socket board includes the steps of
- (a) mounting said auxiliary inspecting apparatus on one surface of said socket board, and
- (b) mounting said semiconductor integrated circuit device on the other surface of said socket board, wherein
  - in said steps (a) and (b), I/O terminals of said auxiliary inspecting apparatus are connected to corresponding I/O terminals of said semiconductor integrated circuit device via through holes.

9. The semiconductor inspecting method according to claim 8, wherein said step of mounting said auxiliary inspecting apparatus and said semiconductor integrated circuit device on the same socket board includes the steps of connecting said auxiliary inspecting apparatus to said socket board through an IC socket, and
connecting said semiconductor integrated circuit device to said socket board through an IC socket.

10. The semiconductor inspecting method according to claim 6, wherein said step of mounting said auxiliary inspecting apparatus and said semiconductor integrated circuit device on the same socket board includes the step of (c) connecting said semiconductor integrated circuit device to said socket board through an IC socket including said auxiliary inspecting apparatus, wherein in said step (c), I/O terminals of said semiconductor integrated circuit device are connected to corresponding I/O terminals of said auxiliary inspecting apparatus included in said IC socket.

11. A semiconductor inspecting method for inspecting a semiconductor integrated circuit device using a semiconductor inspecting system including a semiconductor inspecting apparatus and an auxiliary inspecting apparatus, comprising the steps of:
- generating write signals in said auxiliary inspecting apparatus based on a logic pattern from said semiconductor inspecting apparatus to output said write signals from said auxiliary inspecting apparatus to said semiconductor integrated circuit device;
- outputting a signal from said semiconductor integrated circuit device in response to each write signal;
- receiving said signal from said semiconductor integrated circuit device by said auxiliary inspecting apparatus;
- determining by said auxiliary inspecting apparatus whether said signal output from said semiconductor integrated circuit device is a prescribed signal or not; and
- transmitting the determination result from said auxiliary inspecting apparatus to said semiconductor inspecting apparatus.

12. A semiconductor inspecting method for inspecting a semiconductor integrated circuit device using a semiconductor inspecting apparatus, comprising the steps of:
- (d) mounting on one surface of a socket board of said semiconductor inspecting apparatus, said semiconductor integrated circuit device to be inspected;
- (e) mounting another semiconductor integrated circuit device on the other surface of said socket board, said another semiconductor integrated circuit device having a same specification as that of said semiconductor integrated circuit device and having been determined as non-defective;
- (f) outputting a plurality of write signals from said semiconductor inspecting apparatus to said semiconductor integrated circuit devices; and
- (g) receiving by said semiconductor inspecting apparatus a power supply current flowing through said semiconductor integrated circuit devices in response to said write signals.

13. The semiconductor inspecting method according to claim 12, wherein said steps (d) and (e) include the step of connecting said semiconductor integrated circuit devices to said socket board through IC sockets.

* * * * *